US012695422B2

(12) United States Patent
Ayraud et al.

(10) Patent No.: US 12,695,422 B2
(45) Date of Patent: Jul. 28, 2026

(54) ELECTRONIC OSCILLATOR WITH INDEPENDENT CONTROLS OF VARIABLE CAPACITIES

(71) Applicant: STMicroelectronics International N.V., Geneva (CH)

(72) Inventors: Michel Ayraud, Voreppe (FR); Fernando Jose Ramalho Teixeira, Jr., Grenoble (FR)

( * ) Notice: Subject to any disclaimer, the term of this patent is extended or adjusted under 35 U.S.C. 154(b) by 0 days.

(21) Appl. No.: 18/943,506

(22) Filed: Nov. 11, 2024

(65) Prior Publication Data

US 2025/0167733 A1      May 22, 2025

(30) Foreign Application Priority Data

Nov. 20, 2023      (FR) ...................................... 2312758

(51) Int. Cl.
   H03B 5/36 (2006.01)
(52) U.S. Cl.
   CPC ............. H03B 5/364 (2013.01); H03B 5/368 (2013.01); H03B 2200/0012 (2013.01); H03B 2200/005 (2013.01); H03B 2201/0208 (2013.01); H03B 2201/0291 (2013.01); H03J 2200/10 (2013.01)
(58) Field of Classification Search
   CPC ... H03B 5/30; H03B 5/32; H03B 5/36; H03B 5/362; H03B 5/364; H03B 5/366; H03B 5/368; H03B 2200/0012; H03B 2200/005; H03B 2201/0208; H03B 2201/0266; H03B 2201/0291; H03J 2200/10
   See application file for complete search history.

(56) References Cited

U.S. PATENT DOCUMENTS

| | | | | |
|---|---|---|---|---|
| 5,446,420 A * | 8/1995 | Westwick | .......... | G01R 31/2824 |
| | | | | 331/175 |
| 6,337,604 B1 * | 1/2002 | Clarke | .................... | H03B 5/366 |
| | | | | 331/116 R |
| 6,400,231 B1 * | 6/2002 | Leduc | .................. | H03K 3/0307 |
| | | | | 331/116 R |
| 6,559,730 B1 | 5/2003 | Marvin et al. | | |
| 7,280,001 B2 | 10/2007 | Maligeorgos et al. | | |
| 7,689,190 B2 * | 3/2010 | Kerth | ........................ | H03J 7/04 |
| | | | | 455/146 |
| 7,868,710 B1 * | 1/2011 | Farahvash | .............. | H03B 5/366 |
| | | | | 331/177 V |
| 11,171,625 B1 | 11/2021 | Sankaragomathi et al. | | |
| 2003/0067361 A1 * | 4/2003 | Takahashi | ................. | H03L 7/08 |
| | | | | 331/176 |
| 2009/0096541 A1 * | 4/2009 | Tran | ........................ | H03B 5/06 |
| | | | | 331/116 R |
| 2010/0039194 A1 * | 2/2010 | Darabi | .................... | H03B 5/364 |
| | | | | 334/55 |
| 2014/0091872 A1 * | 4/2014 | Itasaka | .................... | H03L 7/099 |
| | | | | 331/36 C |
| 2017/0170784 A1 * | 6/2017 | Huang | ................... | H03B 5/362 |

(Continued)

*Primary Examiner* — Levi Gannon
(74) *Attorney, Agent, or Firm* — Seed Intellectual Property Law Group LLP

(57)      ABSTRACT

The present description concerns an electronic oscillator comprising a resonator coupled in parallel to at least one active circuit, the resonator comprising two electrodes coupled to separate variable capacitive elements forming a charge capacitive element of the electronic oscillator, and a control device configured to independently control the values of the variable capacitive elements.

20 Claims, 3 Drawing Sheets

(56) References Cited

U.S. PATENT DOCUMENTS

| 2018/0198451 | A1   | 7/2018 | Jung et al. |          |
|--------------|------|--------|-------------|----------|
| 2019/0006991 | A1 * | 1/2019 | Marques     | H03B 5/366 |
| 2020/0304066 | A1 * | 9/2020 | Itasaka     | H03B 5/20 |
| 2021/0058088 | A1 * | 2/2021 | Takahashi   | G04G 3/04 |

* cited by examiner

ELECTRONIC OSCILLATOR WITH INDEPENDENT CONTROLS OF VARIABLE CAPACITIES

This application claims the priority benefit of French patent application number 23/12758, filed on Nov. 20, 2023, entitled "Electronic oscillator with independent controls of variable capacities" which is hereby incorporated by reference to the maximum extent allowable by law.

BACKGROUND

Technical Field

The present disclosure generally concerns the field of electronic oscillators.

Description of the Related Art

Electronic oscillators using quartz resonators are widely used in SoCs (systems on chip), microcontrollers, radio devices, etc., particularly in the RF (radio frequency) field. The high quality factor and low intrinsic electrical resistance of quartz resonators enable them to keep a stable oscillation with a low power consumption. An architecture often used for such oscillators corresponds to that of Pierce oscillators.

A fine adjustment of the oscillation frequency of such an oscillator is sometimes necessary, for example in certain systems such as UWB (Ultra Wide Band) systems allowing, among others, a precise tracking of objects. This adjustment of the oscillation frequency is performed by varying the value of a charge capacitive element coupled to the resonator of the oscillator. This charge capacitive element may be formed by a plurality of capacitors distributed into one or a plurality of capacitor banks. This or these capacitor bank(s) may be integrated on a chip with the oscillator.

With existing oscillators, the greater the accuracy required for the adjustment of the value of the charge capacitive element, the larger the number of capacitors in the banks has to be. For example, when the resonator used is of piezo-electric MEMS type, the value required for the charge capacitive element is generally lower than for a quartz resonator. Now, the lower the value of the charge capacitive element, the greater the variation of the oscillation frequency of the oscillator for a given variation of the charge capacitance. This results in an accuracy of adjustment of the value of the charge capacitive element which has to be higher.

BRIEF SUMMARY

There exists a need for an electronic oscillator which is compatible with existing quartz and MEMS technologies, and in which an accurate adjustment of the oscillation frequency is easily achievable.

An embodiment overcomes all or part of the disadvantages of known solutions and provides an electronic oscillator comprising a resonator coupled in parallel with at least one active circuit, the resonator comprising two electrodes coupled to distinct variable capacitive elements forming a charge capacitive element of the electronic oscillator, and a control device configured to independently control values of the variable capacitive elements.

According to a specific embodiment, the control device comprises a digital circuit.

According to a specific embodiment, each of the variable capacitive elements comprises a bank of capacitors of different values.

According to a specific embodiment, each capacitor bank is configured so that a value of the corresponding variable capacitive element is at least equal to a value of a first capacitor of the capacitor bank.

According to a specific embodiment, each capacitor bank further comprises at least one second capacitor coupled to a switch controllable by the control device to couple or not the second capacitor in parallel with the first capacitor of the capacitor bank.

According to a specific embodiment, the bank of capacitors comprise capacitors having identical values from one bank of capacitors to the another.

According to a specific embodiment, the control device comprises an adder configured to add a least significant bit of a control signal coded over a plurality of bits with a binary number formed of the bits of the control signal other than the least significant bit of the control signal, and the control device is configured to apply an output signal of the adder to at least one control input of a first bank of capacitors and to apply the binary number to at least one control input of a second bank of capacitors.

According to a specific embodiment, the control device comprises a Look Up Table (LUT), or a synthesized combinational logic circuit, or a microcontroller.

According to a specific embodiment, the resonator corresponds to a quartz resonator or to a Micro-Electro-Mechanical System (MEMS) resonator.

According to a specific embodiment, the at least one active circuit comprises an inverter amplifier.

According to a specific embodiment, the inverter amplifier comprises at least one Metal-Oxide-Semiconductor (MOS) transistor.

According to a specific embodiment, the inverter amplifier further comprises a feedback impedance coupled to the MOS transistor.

According to a specific embodiment, the variable capacitive elements are each configured so that a corresponding value is variable within a range from 2 pF to 20 pF.

There is also provided an RF transmission device, comprising at least one electronic oscillator according to a specific embodiment.

There is also provided a control method of an electronic oscillator. The control method includes coupling a resonator in parallel with at least one active circuit, the resonator comprising two electrodes coupled to distinct variable capacitive elements forming a charge capacitive element of the electronic oscillator, and independently controlling, by a control device, values of the variable capacitive elements.

According to a specific embodiment, the control device comprises a digital circuit, each of the variable capacitive elements comprises a bank of capacitors having different values, the control device comprises an adder configured to add a least significant bit of a control signal coded over a plurality of bits to a binary number comprising the other bits of the control signal, and the control method comprises: receiving the control signal at an input of the adder, then adding, by the adder, the least significant bit of the control signal with the binary number comprising the bits of the control signal other than the least significant bit of the control signal, then applying, by the control device, an output signal of the adder to at least one control input of a first one of the capacitor banks, and applying the binary number to at least one control input of a second one of the capacitor banks.

According to a specific embodiment, the at least one control input of the first bank of capacitors and the at least one control input of the second bank of capacitors are control inputs of controllable switches.

According to a specific embodiment, when the least significant bit of the control signal has a '0' value, the output signal of the adder is equal to the binary number comprising the bits of the control signal other than the least significant bit of the control signal; and when the least significant bit of the control signal has a '1' value, the output signal of the adder is equal to a sum of a '1' bit with the binary number comprising the bits of the control signal other than the least significant bit of the control signal.

According to a specific embodiment, when the least significant bit of the control signal has the '0' value, the values of the variable capacitive elements are identical one to each other; and when the least significant bit of the control signal has the '1' value, the values of the variable capacitive elements are different from each other.

BRIEF DESCRIPTION OF THE SEVERAL VIEWS OF THE DRAWINGS

The foregoing features and advantages, as well as others, will be described in detail in the rest of the disclosure of specific embodiments given as an illustration and not limitation with reference to the accompanying drawings, in which.

DETAILED DESCRIPTION

Like features have been designated by like references in the various figures. In particular, the structural and/or functional features that are common among the various embodiments may have the same references and may dispose identical structural, dimensional and material properties.

For clarity, only those steps and elements which are useful to the understanding of the described embodiments have been shown and are described in detail. In particular, the implementation of different elements and circuits, for example the resonator, the adder, the controllable switches, etc., is not detailed. Those skilled in the art will be capable of implementing in detailed fashion the different elements and the different functions of the described electronic oscillator, based on the functional description given hereafter.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements. Moreover, in all the document, the term "coupled" has to be understood as meaning "electrically coupled."

In the following description, where reference is made to absolute position qualifiers, such as "front," "back," "top,"

"bottom," "left," "right," etc., or relative position qualifiers, such as "top," "bottom," "upper," "lower," etc., or orientation qualifiers, such as "horizontal," "vertical," etc., reference is made unless otherwise specified to the orientation of the drawings.

Unless specified otherwise, the expressions "about," "approximately," "substantially," and "in the order of" signify plus or minus 10%, preferably of plus or minus 5%.

Figure 1:
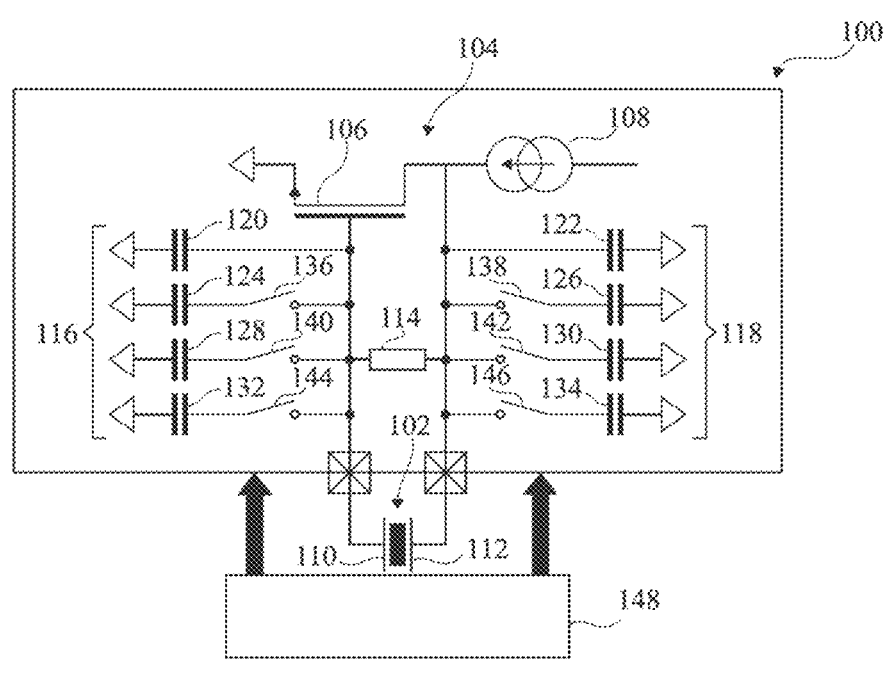
FIG. 1 shows an electronic oscillator according to a specific embodiment.

An electronic oscillator 100 according to a specific embodiment is described hereafter in relation with FIG. 1.

Electronic oscillator 100 comprises a resonator 102. Resonator 102 is, for example, a quartz resonator or a piezoelectric MEMS resonator. Such a piezoelectric MEMS resonator for example comprises a layer of doped silicon covered with a layer of piezoelectric material such as AlN.

Electronic oscillator 100 further comprises an active circuit 104, that is, an electronic circuit or component providing a gain, coupled in parallel with resonator 102. According to an embodiment, active circuit 104 corresponds to an inverter amplifier comprising at least one MOS transistor 106, for example of type N, coupled to a current source 108. In the example of FIG. 1, active circuit 104 is coupled to two electrodes 110, 112 of resonator 102. In the example of FIG. 1, the gate of transistor 106 is coupled to electrode 110 of resonator 102, and the drain of transistor 106 is coupled to electrode 112 of resonator 102. According to an embodiment, transistor 106 may be a GO2-type transistor (that is, comprising a thick gate oxide), which exhibits a good robustness against electrostatic discharges. As a variant, transistor 106 may be of GO1 type. As a variant, active circuit 104 may comprise other types of transistors.

In the described example, electronic oscillator 100 further comprises a feedback impedance 114 coupled in parallel with resonator 102. In the example of FIG. 1, this feedback impedance 114 corresponds to an electrical resistor.

The electronic oscillator 100 described in this example corresponds to a Pierce oscillator. As a variant, electronic oscillator 100 may be different from a Pierce oscillator.

The electrodes 110, 112 of resonator 102 are coupled to distinct variable capacitive elements 116, 118 forming the charge capacitive element of electronic oscillator 100. According to a specific embodiment, each of variable capacitive elements 116, 118 comprises a bank of capacitors which may or not have different values from one another.

In the example of FIG. 1, each capacitor bank of variable capacitive elements 116, 118 comprises a first capacitor 120, 122 having a value corresponding to the minimum value of each of variable capacitive elements 116, 118. In the shown example, this first capacitor 120, 122 of each of variable capacitive elements 116, 118 always remains coupled to resonator 102. In other words, the coupling between the first capacitor 120, 122 of each of variable capacitive elements 116, 118 and resonator 102 is not interrupted during the operation of electronic oscillator 100. In this embodiment, the value of each of the first capacitors 120, 122 is called "Cfixed."

In the example of FIG. 1, one of the two electrodes of each of the first capacitors 120, 122 is coupled to one of the electrodes 110, 112 of resonator 102, and the other of the two electrodes of each of the first capacitors 120, 122 is coupled to a reference electrical potential of electronic oscillator 100, for example the ground of electronic oscillator 100.

In the described example of embodiment, each capacitor bank of variable capacitive elements 116, 118 comprises, in addition to the first capacitor 120, 122, at least one second capacitor coupled to a controllable switch, itself coupled to one of the electrodes 110, 112 of resonator 102. In the example of embodiment described herein, each capacitor bank of variable capacitive elements 116, 118 comprises a plurality of other capacitors, each coupled to a switch which is controllable independently from the others and which is coupled to one of the electrodes 110, 112 of resonator 102. In the example of FIG. 1, each capacitor bank of variable capacitive elements 116, 118 comprises a second, a third, and a fourth capacitors, respectively designated with references 124, 128, 132 for variable capacitive element 116 and designated with references 126, 130, 134 for variable capacitive element 118. In the example of FIG. 1, each of capacitors 124 to 134 comprises a first electrode electrically coupled to the reference electrical potential and a second electrode coupled to a controllable switch, respectively designated with references 136, 138, 140, 142, 144, and 146. Thus, in each of the capacitor banks of capacitive elements 116, 118, each of capacitors 124 to 134 may be coupled in parallel with the first capacitor 120, 122 according to the off or on state of the controllable switch 136 to 146 coupled to each of these capacitors 124 to 134.

In the shown example of embodiment, the capacitors of the banks of variable capacitive elements 116, 118 have values identical from one bank to the other. In the example of FIG. 1, the values of the second, third, and fourth capacitors 124 to 134 are respectively equal to C, C/2, and C/4. Thus, in this example, each of variable capacitive elements 116, 118 can take, according to the state of controllable switches 136 to 146, one of the following values: Cfixed, Cfixed+C/4, Cfixed+C/2, Cfixed+3C/4, Cfixed+C, Cfixed+5C/4, Cfixed+3C/2, Cfixed+7C/4.

Values C and Cfixed may here be selected according to the required value of the charge capacitive element of electronic oscillator 100. According to an example of embodiment, values C and Cfixed may be selected such that the values of variable capacitive elements 116, 118 can vary within a range from 2 pf to 20 pF, which enables to vary the charge capacitance of oscillator 100 with a value in the range from 1 pF to 10 pF.

Electronic oscillator 100 further comprises a control device 148 configured to independently control the values of variable capacitive elements 116, 118, that is, such that the values of variable capacitive elements 116, 118 can be similar to or different from each other. In the described example of embodiment, control device 148 is configured to send control signals to the controllable switches 136 to 146 of each of variable capacitive elements 116, 118.

In the described example of embodiment, control device 148 comprises or corresponds to a digital circuit. In the example of FIG. 1, control device 148 is configured to deliver a first control signal coded over a plurality of bits to control the switches 136, 140, 144 of the capacitor bank of the first variable capacitive element 116, and to deliver a second control signal coded over a plurality of bits to control the switches 138, 142, 146 of the capacitor bank of the second variable capacitive element 118.

Since variable capacitive elements 116, 118 are controlled independently from each other, the values of the first and second control signals sent by control device 148 may be similar when the values of variable capacitive elements 116, 118 are intended to be similar, or be different when the values of variable capacitive elements 116, 118 are intended to be different from each other.

Figure 2:
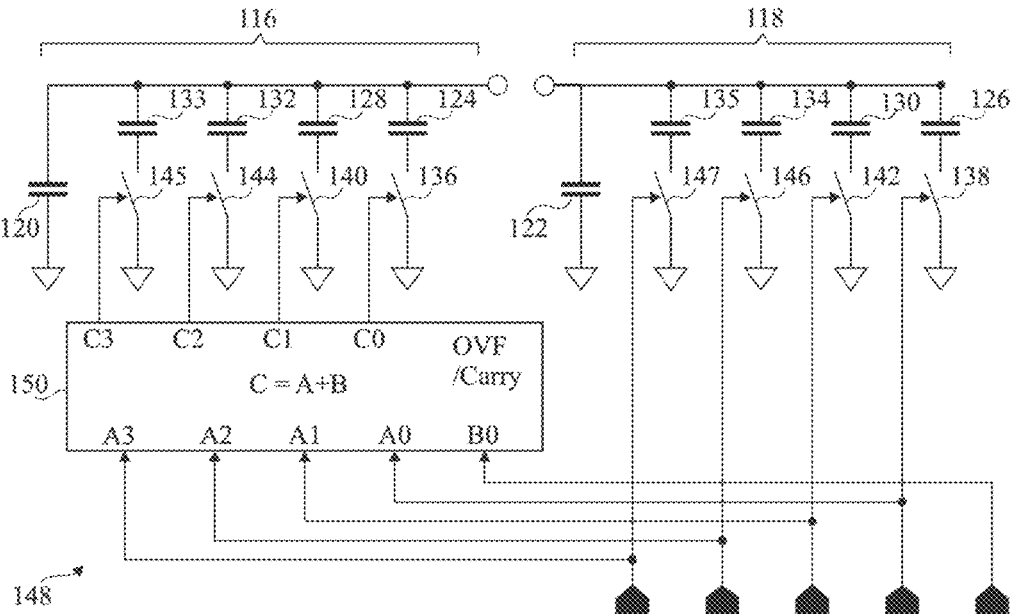
FIG. 2 shows part of the elements of an electronic oscillator according to a specific embodiment.

Another example of embodiment of variable capacitive elements 116, 118 and of control device 148 is shown in FIG. 2.

In this other example, each of variable capacitive elements 116, 118 comprises a bank of capacitors comprising the first capacitor 120, 122 of value "Cfixed" as well as second, third, fourth capacitors 124 to 134 as well as a fifth capacitor 133, 135 having, in this other example, values respectively equal to C, 2C, 4C, and 8C. In the example of FIG. 2, each of capacitors 124 to 135 comprises a first electrode electrically coupled to the electrical reference potential of electronic oscillator 100 and a second electrode coupled to a controllable switch 136 to 147 (the fifth capacitors 133, 135 are coupled to controllable switches 145, 147). Thus, in this example, each of variable capacitances 116, 118 may take, according to the state of controllable switches 136 to 147, a value in the range from Cfixed to Cfixed+15C, with intermediate values equal to Cfixed+a*C, a being an integer in the range from 1 to 14. Values C and Cfixed are for example selected so that the values of the variable capacitive elements 116, 118 can vary within a range from 2 pf to 20 pF.

In this other example, control device 148 comprises an adder 150 configured to receive as an input an initial control signal coded over a plurality of bits (one input for each bit of the initial control signal). In the described example of embodiment, the number of bits of the initial control signal is equal to the number of capacitors in each capacitor bank of variable capacitive elements 116, 118, that is, 5 in the example of FIG. 2. In this example, adder 150 is configured to add a least significant bit of the initial control signal to a binary number formed by the other bits of the initial control signal. Further, in the described example, control device 148 is configured to apply an output signal of adder 150 to at least one control input (one for each bit in the described example) of the first variable capacitor 116 in order to control the controllable switches of this first variable capacitive element 116. In this example, a binary number formed of the bits of the initial control signal other than the least significant bit is applied to at least one control input (one for each bit in the described example) of the second variable capacitive element 118 in order to control the controllable switches of this second variable capacitive element 118. In the described example, the number of bits of the signals sent to the inputs of variable capacitive elements 116, 118 is equal to the number of controllable switches of each of the capacitor banks of variable capacitive elements 116, 118.

Thus, in the example of FIG. 2, adder 150 is configured to perform the addition C=A+B, with B corresponding to the least significant bit of the initial control signal, A corresponding to the binary number formed by the bits at the input of adder 150 (which also corresponds to the control signal sent to the second variable capacitive element 118), and C corresponding to the binary number obtained at the output of adder 150 (which forms the control signal sent to the first variable capacitive element 116). In the example of FIG. 2, the least significant bit of the initial control signal is applied to an input "B0" of adder 150, the other bits of this initial control signal are applied to inputs "A0," "A1," "A2," and "A3" of adder 150, and the output signal of adder 150 is delivered on the outputs "C0," "C1," "C2," and "C3" of adder 150.

Thus, in the configuration shown in FIG. 2, when the least significant bit of the initial control signal applied to adder 150 has value '0,' the binary number delivered at the output of adder 150 is equal to the binary number formed by the other bits of the initial control signal applied to the input of adder 150. In this case, the control signals applied to the controllable switches of the capacitor banks of variable capacitive elements 116, 118 are identical, which results in that variable capacitive elements 116, 118 have an identical value. When the bit of the initial control signal applied to input B of adder 150 has value '1,' the binary number delivered on the bits of output C is equal to the sum of a bit '1' with the binary number formed by the other bits of the initial control signal received by adder 150. In this case, the control signals applied to the controllable switches of the capacitor banks of variable capacitive elements 116, 118 are different and variable capacitive elements 116, 118 have different values such that C116=C118+C, with C116 and C118 respectively corresponding to the values of variable capacitive elements 116 and 118. To avoid a problem in case of an exceeding of the capacitance of adder 150 (an "overflow" situation when all the bits applied at the input are set to "1"), control device 148 may comprise OR gates at the output of adder 150 in order to set to state "1" the outputs of control device 148 in such a case.

The operation of electronic oscillator 100 is described in further detail hereafter.

Figure 3:
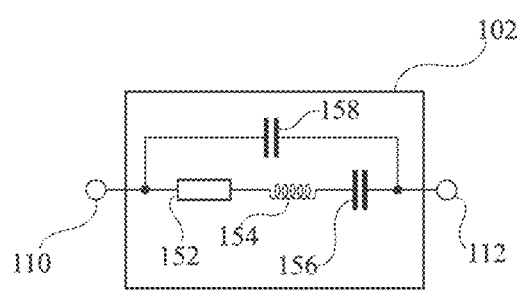
FIG. 3 and FIG. 4 show equivalent circuit diagrams of a resonator used in an electronic oscillator according to a specific embodiment.

FIG. 3 shows an equivalent circuit diagram of resonator 102, this circuit diagram being applicable for a quartz or piezoelectric MEMS resonator 102. Resonator 102 can be electrically modeled by a resistor 152, corresponding to the equivalent series resistance of resonator 102, electrically coupled in series between the first electrode 110 of resonator 102 and an inductance 154, itself electrically coupled in series with a first electrode of a first capacitive element 156. Resistor 152 is representative of the mechanical losses of resonator 102, and its value is proportional to the quality factor of resonator 102 (lower in the case of a piezoelectric MEMS-type resonator than for a quartz resonator). Inductance 154 is representative of the elasticity of resonator 102, and first capacitive element 156 is representative of the mechanical inertia of resonator 102. A second electrode of first capacitive element 156 is coupled to the second electrode 112 of resonator 102. A second capacitor 158 is electrically coupled in parallel with the assembly formed by resistor 152, inductance 154, and first capacitive element 156. Second capacitive element 158 is representative of the parasitic capacitance of resonator 102 (which is associated with the thickness of the piezoelectric film and its dielectric permittivity in the case of a piezoelectric MEMS-type resonator 102).

Figure 4:
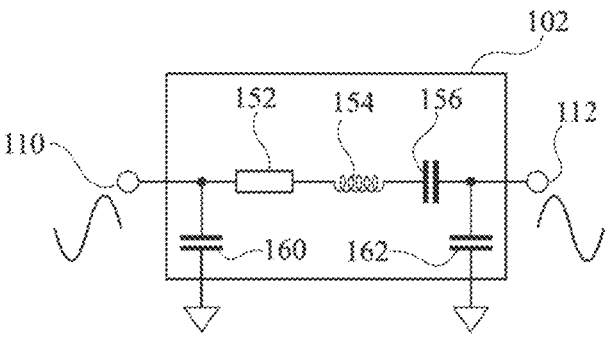

FIG. 4 shows the equivalent circuit diagram of resonator 102 when it receives on its electrodes 110, 112 opposite signals or signals in phase opposition. In this case, the second capacitive element 158 previously described in relation with FIG. 3 can be seen as forming two distinct capacitive elements, designated with references 160 and 162, each comprising an electrode coupled to a reference electrical potential for example corresponding to the ground of resonator 102 or to a virtual ground. The value of each of the two capacitive elements 160, 162 is equal to twice that of capacitive element 158.

Figure 5:
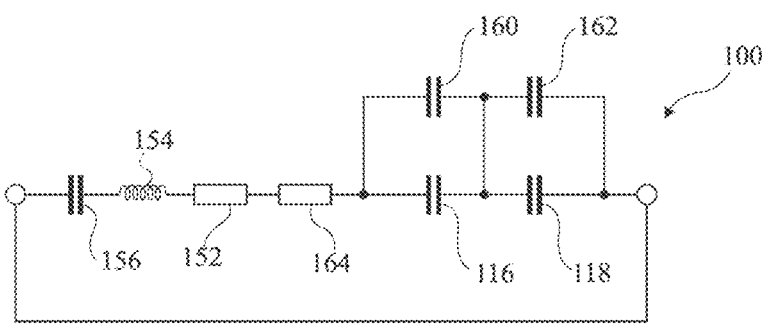
FIG. 5 shows an equivalent circuit diagram of an electronic oscillator according to a specific embodiment.

FIG. 5 shows an equivalent circuit diagram of electronic oscillator 100. In this circuit diagram, in addition to the elements of resonator 102 previously described in relation with FIG. 4, active circuit 104 may be electrically modeled by a negative electrical resistor 164, for example, having a value equal to $-Gm/((2C0+C116)\cdot(2C0+C118)\cdot2\pi\cdot f)^2$, with Gm corresponding to the transconductance of transistor 106 (having a value proportional to the consumed bias current) and f corresponding to the oscillation frequency of resonator 102. The oscillation frequency $f_{osc}$ of electronic oscillator 100 is equal to:

$$f_{osc} = \frac{1}{2\pi\sqrt{Lm.Ceq}} \qquad \text{Math 1}$$

With Lm equal to the value of inductance 154, and Ceq the value of the equivalent capacitive element formed by the various capacitive elements of the circuit diagram of FIG. 5, and which is such that:

$$\frac{1}{Ceq} = \frac{1}{Cm} + \frac{1}{C116 + 2.C0} + \frac{1}{C118 + 2.C0} \qquad \text{Math 2}$$

With Cm corresponding to the value of the first capacitive element 156, and C0 corresponding to the value of the second capacitive element 158.

Electronic oscillator 100 is in a stable oscillation state when the sum of the values of electrical resistors 152 and 164 is zero. Since the values of Lm, Cm, and C0 cannot be modified, the setting of the oscillation frequency $f_{osc}$ of electronic oscillator 100 is performed by setting the values of variable capacitive elements 116, 118, which amounts to modifying the value of Ceq, and thus of $f_{osc}$. Considering the equivalent circuit diagram of electronic oscillator 100, the greater the value of equivalent series resistor 152, the greater the value of negative electrical resistor 164 must be in order to compensate for resistance 152, which results in a higher transconductance Gm (and therefore in more current supplied by transistor 106) or in a lower ratio (2C0+C116)/(2C0+C118) obtained by adjusting the values of C116 and C118 (value C0 not being adjustable since it depends on the physical characteristics of resonator 102).

Thus, in order to adjust the oscillation frequency of electronic oscillator 100 to compensate for possible variations of resonator 102 (generally+/−10 ppm), the values of variable capacitive elements 116, 118 are selected by applying the desired control signals at the input of these capacitive elements, the value CL of the obtained charge capacitive element being such that CL= (C116+C118)/2. Thus, considering that the value of each of variable capacitive elements 116, 118 can be adjusted with a pitch equal to 1 pF, the independent control of the values of the variable capacitive elements enables to adjust value CL with a pitch equal to 0.25 pF.

Figure 6:
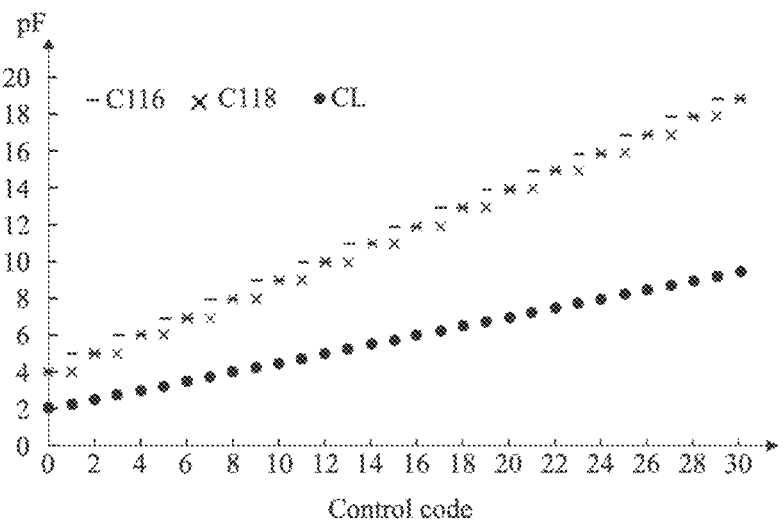
FIG. 6 shows examples of values of charge capacitive elements obtained with an electronic oscillator according to a specific embodiment.

FIG. 6 shows the values of the charge capacitive element CL obtained with variable charge capacitive elements 116, 118 such as previously described in relation with FIG. 2, with Cfixed=4 pF and C=1 pF. The x-axis represents the value of the binary word applied at the input of adder 150 and to the control inputs of second variable charge capacitive element 118. The obtained values of charge capacitive element CL form a monotonous straight line well suited to a fine control of the oscillation frequency of electronic oscillator 100. In the example of FIG. 6, with a 4-bit control signal, 31 different values of charge capacitive element CL are possible.

When resonator 102 is of MEMS type, all the components of oscillator 100 can be formed within a same chip, for example of SoC type.

Electronic oscillator 100 provides a solution enabling to increase the resolution of adjustment of the oscillation frequency of the oscillator via an adjustment independent from the value of each of the variable capacitive elements forming the charge capacitive element of the electronic oscillator.

An advantage of the electronic oscillator 100 described hereabove is that resonator 102 and/or active circuit 104 and/or variable capacitors 116, 118 may correspond to existing elements to which control device 148 is added. For example, an advantage of using a digital control device 148 is its addition is simpler than modifying or adding analog elements, for example adding capacitors to the capacitor banks of variable capacitive elements 116, 118.

In a specific configuration, electronic oscillator 100 may have the advantages provided by the use of a Pierce-type oscillator structure, that is, in particular, a low electric current consumption, a low noise, a possible high-frequency operation, and a good robustness against electrostatic discharge.

Electronic oscillator 100 enables to guarantee a monotonic character of the values of the charge capacitive elements likely to be obtained, without complicating its layout or design, and while using a decreased number of capacitors or without increasing the number of capacitors used as compared with existing solutions.

Figure 7:
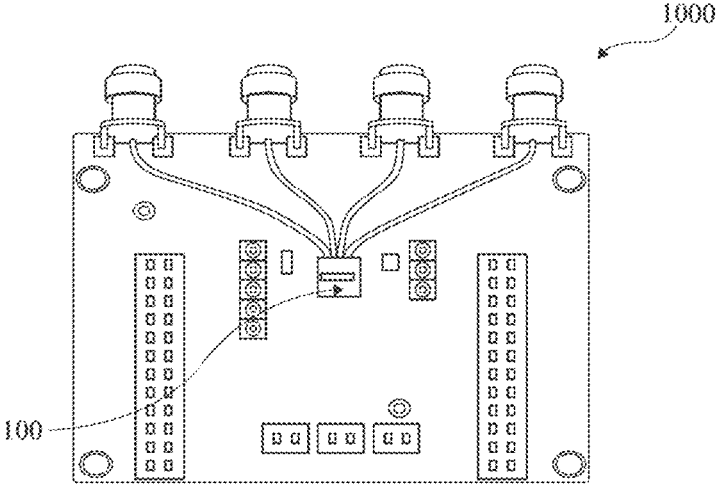
FIG. 7 shows an RF transmission device comprising an electronic oscillator according to a specific embodiment.

Electronic oscillator 100 may apply to the RF field and in particular to that of RF SoCs, or the field of transceivers and/or that of UWB/NB (narrowband) IoT (Internet of Things) devices. FIG. 7 shows an example of an RF transmission device 1000, corresponding to a UWB transceiver in this example, comprising an electronic oscillator 100 such as previously described.

In the examples described hereabove, electronic oscillator 100 is of Pierce type. As a variant, oscillator 100 may correspond to an oscillator of another type. Further, active circuit 104 may be different from that previously described.

The number of capacitors forming the variable capacitive elements, and thus also the number of bits used to control the values of the variable capacitive elements, may be different from those of the previously described examples.

Control devices 148 different from that previously described, that is, comprising one or a plurality of electronic components or circuits other than an adder, may be used to fulfill the same functions as those fulfilled by the previously-described example of control device 148. For example, the control device may comprise a LUT (Look Up Table), or a synthesized combinational logic circuit, or a microcontroller.

Various embodiments and variants have been described. Those skilled in the art will understand that certain features of these various embodiments and variants may be combined, and other variants will occur to those skilled in the art.

Finally, the practical implementation of the described embodiments and variants is within the abilities of those skilled in the art based on the functional indications given hereabove.

Electronic oscillator (100) may be summarized as including a resonator (102) coupled in parallel with at least one active circuit (104), the resonator (102) including two electrodes (110, 112) coupled to distinct variable capacitive elements (116, 118) forming a charge capacitive element of the electronic oscillator (100), and a control device (148) configured to independently control values of the variable capacitive elements (116, 118).

The control device (148) may include a digital circuit.

Each of the variable capacitive elements (116, 118) may include a bank of capacitors (120-135) having different values.

Each capacitor bank (120-135) may be configured so that a value of the corresponding variable capacitive element (116, 118) is at least equal to a value of a first capacitor (120, 122) of the capacitor bank (120-135).

Each capacitor bank (120-135) may further include at least one second capacitor (124-135) coupled to a controllable switch (136-147) by the control device (148) to couple or not the second capacitor (124-135) in parallel with the first capacitor (120, 122) of the capacitor bank (120-135).

The bank of capacitors (120-135) of the variable capacitive elements (116, 118) may include capacitors (120-135) having values identical from one bank of capacitors (120-135) to another.

Each of the variable capacitive elements (116, 118) may include a bank of capacitors (120-135) having different values, and the control device (148) may include an adder (150) configured to add a least significant bit of a control signal coded over a plurality of bits to a binary number formed of the bits of the control signal other than the least significant bit of the control signal, and the control device (148) may be configured to apply an output signal of the adder (150) to at least one control input of a first one of the bank of capacitors (120, 124, 128, 132, 133) and to apply the binary number to at least one control input of a second one of the bank of capacitors (122, 126, 130, 134, 135).

The control device (148) may include a Look Up Table (LUT), or a synthesized combinational logic circuit, or a microcontroller.

The resonator (102) may correspond to a quartz resonator or to a Micro-Electro-Mechanical System (MEMS) resonator.

The at least one active circuit (104) may include an inverter amplifier.

The inverter amplifier may include at least one Metal-Oxide-Semiconductor (MOS) transistor (106).

The inverter amplifier may further include a feedback impedance (114) coupled to the MOS transistor (106).

The variable capacitive elements (116, 118) may each be configured so that a corresponding value is variable within a range from 2 pF to 20 pF.

A radio frequency (RF) transmission device (1000) may be summarized as including at least one electronic oscillator (100) including a resonator coupled in parallel with at least one active circuit, the resonator comprising two electrodes coupled to distinct variable capacitive elements forming a charge capacitive element of the electronic oscillator, and a control device configured to independently control values of the variable capacitive elements.

A control method of an electronic oscillator (100) may be summarized as including coupling a resonator (102) in parallel with at least one active circuit (104), the resonator (102) including two electrodes (110, 112) coupled to distinct variable capacitive elements (116, 118) forming a charge capacitive element of the electronic oscillator (100), and independently controlling, by a control device (148), values of the variable capacitive elements (116, 118).

The control device (148) may include a digital circuit, and each of the variable capacitive elements (116, 118) may include a bank of capacitors (120-135) having different values, and the control device (148) may include an adder (150) configured to add a least significant bit of a control signal coded over a plurality of bits to a binary number comprising the bits of the control signal other than the least significant bit of the control signal, and the control method may include: receiving the control signal at the input of the adder (150), then adding, by the adder (150), the least significant bit of the control signal with the binary number including the bits of the control signal other than the least significant bit of the control signal, then applying, by the control device (148), an output signal of the adder (150) to at least one control input of a first bank of capacitors (120, 124, 128, 132, 133), and applying the binary number to at least one control input of a second bank of capacitors (122, 126, 130, 134, 135).

The at least one control input of the first bank of capacitors and the at least one control input of the second bank of capacitors (120, 124, 128, 132, 133) may be control inputs of controllable switches (136-147).

When the least significant bit of the control signal has a '0' value, the output signal of the adder (150) may be equal to the binary number comprising the bits of the control signal other than the least significant bit of the control signa; and when the least significant bit of the control signal has a '1' value, the output signal of the adder (150) may be equal to a sum of a '1' bit with the binary number comprising the bits of the control signal other than the least significant bit of the control signal.

When the least significant bit of the control signal has the '0' value, the values of the variable capacitive elements (116, 118) may be identical one to each other; and when the least significant bit of the control signal has the '1' value, the values of the variable capacitive elements (116, 118) may be different from each other.

The various embodiments described above can be combined to provide further embodiments. All of the U.S. patents, U.S. patent application publications, U.S. patent applications, foreign patents, foreign patent applications and non-patent publications referred to in this specification and/ or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An electronic oscillator comprising:
a resonator coupled in parallel with at least one active circuit, the resonator comprising two electrodes coupled to distinct variable capacitive elements forming a charge capacitive element of the electronic oscillator, wherein each of the variable capacitive elements comprises a bank of capacitors having different values, and
a control device configured to independently control values of the variable capacitive elements,
wherein the control device comprises a digital circuit,
wherein the control device comprises an adder configured to add a least significant bit of a control signal coded over a plurality of bits to a binary number formed of the bits of the control signal other than the least significant bit of the control signal, and
wherein the control device is configured to apply an output signal of the adder to at least one control input of a first bank of capacitors and to apply the binary number to at least one control input of a second bank of capacitors.

2. The electronic oscillator according to claim 1, wherein each capacitor bank is configured so that a value of a corresponding variable capacitive element is at least equal to a value of a first capacitor of the capacitor bank.

3. The electronic oscillator according to claim 2, wherein each capacitor bank further comprises at least one second capacitor coupled to a controllable switch by the control device to couple or not the second capacitor in parallel with the first capacitor of the capacitor bank.

4. The electronic oscillator according to claim 1, wherein the bank of capacitors comprise capacitors having values identical from one bank of capacitors to another.

5. The electronic oscillator according to claim 1, wherein the control device comprises a Look Up Table (LUT), or a synthesized combinational logic circuit, or a microcontroller.

6. The electronic oscillator according to claim 1, wherein the resonator corresponds to a quartz resonator or to a Micro-Electro-Mechanical System (MEMS) resonator.

7. The electronic oscillator according to claim 1, wherein the at least one active circuit comprises an inverter amplifier.

8. The electronic oscillator according to claim 7, wherein the inverter amplifier comprises at least one Metal-Oxide-Semiconductor (MOS) transistor.

9. The electronic oscillator according to claim 8, wherein the inverter amplifier further comprises a feedback impedance coupled to the MOS transistor.

10. The electronic oscillator according to claim 1, wherein the variable capacitive elements are each configured so that a corresponding value is variable within a range from 2 pF to 20 pF.

11. A radio frequency (RF) transmission device, comprising at least one electronic oscillator according to claim 1.

12. The electronic oscillator according to claim 1, wherein the adder is configured such that:
when the least significant bit of the control signal has a '0' value, the output signal of the adder is equal to the binary number comprising the bits of the control signal other than the least significant bit of the control signal; and
when the least significant bit of the control signal has a '1' value, the output signal of the adder is equal to a sum of a '1' bit with the binary number comprising the bits of the control signal other than the least significant bit of the control signal.

13. A control method of an electronic oscillator comprising:
coupling a resonator in parallel with at least one active circuit, the resonator comprising two electrodes coupled to distinct variable capacitive elements forming a charge capacitive element of the electronic oscillator, and
independently controlling, by a control device, values of the variable capacitive elements,
wherein:
the control device comprises a digital circuit,
each of the variable capacitive elements comprises a bank of capacitors having different values, and
the control device comprises an adder configured to add a least significant bit of a control signal coded over a plurality of bits to a binary number comprising the bits of the control signal other than the least significant bit of the control signal, and
wherein the control method comprises:
receiving the control signal at an input of the adder, then
adding, by the adder, the least significant bit of the control signal with the binary number comprising the bits of the control signal other than the least significant bit of the control signal, then

13 applying, by the control device, an output signal of the adder to at least one control input of a first bank of capacitors, and applying the binary number to at least one control input of a second bank of capacitors.

14. The control method according to claim 13, wherein the at least one control input of the first bank of capacitors and the at least one control input of the second bank of capacitors are control inputs of controllable switches.

15. The control method according to claim 13, wherein:

when the least significant bit of the control signal has a '0' value, the output signal of the adder is equal to the binary number comprising the bits of the control signal other than the least significant bit of the control signal; and when the least significant bit of the control signal has a '1' value, the output signal of the adder is equal to a sum of a '1' bit with the binary number comprising the bits of the control signal other than the least significant bit of the control signal.

16. The control method according to claim 15, wherein:
when the least significant bit of the control signal has the '0' value, the values of the variable capacitive elements are identical one to each other; and
when the least significant bit of the control signal has the '1' value, the values of the variable capacitive elements are different from each other.

17. The control method according to claim 13, wherein each of the variable capacitive elements comprises a bank of capacitors having different values.

18. The control method according to claim 17, wherein each capacitor bank is configured so that a value of a corresponding variable capacitive element is at least equal to a value of a first capacitor of the capacitor bank.

19. The control method according to claim 18, wherein each capacitor bank further comprises at least one second capacitor coupled to a controllable switch by the control device to couple or not the second capacitor in parallel with the first capacitor of the capacitor bank.

20. The control method according to claim 17, wherein the bank of capacitors comprise capacitors having values identical from one bank of capacitors to another.

* * * * *